March 14, 1961 E. P. THIAS 2,975,276

FREQUENCY SELECTOR

Filed April 18, 1955 11 Sheets-Sheet 1

INVENTOR.
EDWIN P. THIAS

BY

Ostrolenk & Faber
ATTORNEYS

March 14, 1961 E. P. THIAS 2,975,276

FREQUENCY SELECTOR

Filed April 18, 1955 11 Sheets-Sheet 2

INVENTOR.
EDWIN P. THIAS

BY

Ostrolenk & Faber

ATTORNEYS

March 14, 1961 E. P. THIAS 2,975,276

FREQUENCY SELECTOR

Filed April 18, 1955 11 Sheets-Sheet 3

INVENTOR.
EDWIN P. THIAS

BY

Ostrolenk & Faber

ATTORNEYS

March 14, 1961 E. P. THIAS 2,975,276

FREQUENCY SELECTOR

Filed April 18, 1955 11 Sheets-Sheet 4

INVENTOR.
EDWIN P. THIAS

BY
Ostrolenk & Faber

ATTORNEYS

INVENTOR.
EDWIN P. THIAS

BY

Ostrolenk & Faber

ATTORNEYS

INVENTOR.
EDWIN P. THIAS
By Ostrolenk & Faber
ATTORNEYS

INVENTOR.
EDWIN P. THIAS
By Ostrolenk & Faber
ATTORNEYS

March 14, 1961 E. P. THIAS 2,975,276

FREQUENCY SELECTOR

Filed April 18, 1955 11 Sheets-Sheet 8

INVENTOR.
EDWIN P. THIAS

By Ostrolenk & Faber
ATTORNEYS

March 14, 1961 E. P. THIAS 2,975,276

FREQUENCY SELECTOR

Filed April 18, 1955

11 Sheets-Sheet 9

INVENTOR.
EDWIN P. THIAS

BY

Ostrolenk & Faber

ATTORNEYS

March 14, 1961 E. P. THIAS 2,975,276

FREQUENCY SELECTOR

Filed April 18, 1955 11 Sheets-Sheet 10

INVENTOR.
EDWIN P. THIAS

BY

Ostrolenk & Faber

ATTORNEYS

March 14, 1961

E. P. THIAS 2,975,276

FREQUENCY SELECTOR

Filed April 18, 1955

11 Sheets-Sheet 11

INVENTOR.
EDWIN P. THIAS

BY

Ostrolenk & Faber
ATTORNEYS

United States Patent Office 2,975,276

Patented Mar. 14, 1961

2,975,276

FREQUENCY SELECTOR

Edwin P. Thias, Hollywood, Calif., assignor to Standard Coil Products Co., Inc., Los Angeles, Calif., a corporation of Illinois

Filed Apr. 18, 1955, Ser. No. 501,919

1 Claim. (Cl. 250—40)

The present invention relates to a frequency selector and more particularly to an improved frequency selector having a wide tuning range.

Frequency selectors, especially those used in television receivers, have undergone numerous changes in recent years, the changes being always directed towards reduction of size, improved performance and reduction of costs. In addition to these trends because of the introduction of UHF television channels, the frequency selectors used in television receivers must now have provisions for selecting both VHF and UHF channels.

One of the simplest types of television frequency selectors or television tuners developed up to now is the so-called turret type tuner in which basic components common to all VHF television channels are fixedly mounted on a chassis while VHF tuning means are mounted on panels forming a drum so that rotation of the drum produces the desired selection of VHF television channels.

The selection of television channels by means of this turret type tuner is discrete since each channel corresponds uniquely to one position of the rotating drum. The accurate angular positioning of the drum with respect to the chassis is obtained through the use of accurately located V-notched bearings for the shaft and by means of a notched disc which also operates as one of the supporting discs for the tuning panels. The notched disc is engaged by the detent roller secured to the chassis so that correct positioning of the drum is obtained whenever the roller is in the valley of the particular notch.

In this turret type tuner described in Patent No. 2,496,183 there are two sets of panels, one for tuning the RF section of the tuner, the other for tuning the oscillator converter section tuner. The drum of this turret type tuner was obtained by the interlock between three supporting discs and pairs of insulated tuning panels.

The panels were provided with outwardly mounted movable contacts which engaged stationary contacts mounted on the chassis. The stationary contacts were either button type with a spring bias or kidney spring type.

The stationary contact assembly consisting of the stationary contacts and a dielectric support was mounted in its turn on a metallic plate forming one wall of the tuner chassis.

With the entrant of UHF television stations, a number of television tuners were provided with a separate UHF television tuning device operated in most cases through the same operating shafts of the VHF tuner. These separate UHF tuners were either continuous or discrete and could receive all the UHF channels in addition to the original VHF channels.

It is known, however, that in each particular locality there will be only a few UHF channels, for example, 2, 3 or 4 because of the particular allocation method followed by the F.C.C.

It is easy to see, therefore, that the addition of a lower panel UHF tuner to the VHF tuner is in most cases expensive and wasteful since in most cases the all channel UHF tuners will be used to select only 2, 3 or 4 UHF channels.

Parallel to the development of all channel UHF tuners, panels were produced which carried a first converter so that when inserted in one of the unused positions of a turret type tuner, a single UHF channel would be received.

The use of these strips was based on the inclusion on the strips of a mixer crystal together with circuitry appropriate to convert the UHF signal to either a VHF first I.F. frequency or to the fundamental I.F. of the television receiver. The crystal mixer served to convert the UHF signal to the I.F. and the harmonic generator crystal served to produce harmonic frequencies from the output of the local VHF oscillator so that when applied to the crystal mixer the desired I.F. signal would be obtained.

It is easily seen that whenever three or four UHF channels are receivable in any particular locality, three or four of such sets of panels will be needed, thus producing an expensive television tuner since each UHF panel had its individual mixer crystal and harmonic generator crystal in addition to the tuning circuitry required, such as coils, capacitors and leads.

The television tuner of the present invention is essentially of the turret type but has smaller dimensions; it is considerably easier to manufacture; it is less expensive; it has provisions for receiving a number of UHF channels through either single or double conversion. Furthermore, at the manufacturing plant, a VHF tuner incorporating the present invention can be easily transformed into a UHF tuner by the addition on the chassis of a mixer crystal or both a mixer and a harmonic generator crystal.

These additions are brought about by a new drum structure consisting of a single panel per channel and only two supporting discs, one of which operates also as a positioning or detent disc plus the inclusion of additional contacts on the coil board.

In order to reduce the dimensions of the television tuner, in addition to using a single panel per channel, the number of contacts used for VHF were reduced by using a new input circuit to facilitate the manufacturing process and to improve the electrical performance.

A novel stationary contact assembly has been used in the present television tuner. To further facilitate the assembly of the complete television tuner the stationary contact assembly is mounted on separate subchassis which can be later secured to the main chassis of the television tuner.

Furthermore, separately assembled and then also mounted on the above mentioned sub-chassis is the input panel having provisions for connecting the balanced input transmission line and connecting power leads from the television receiver.

To remove duplication or triplication of crystals for UHF reception, the present invention has provisions for a single mixer crystal and if desired a single harmonic generator crystal mounted on the chassis in such a manner as to provide mixing for all UHF strips assembled on the board.

One object of the present invention is a novel wide range frequency selector that is easy to manufacture and therefore inexpensive.

Another object of the present invention is a novel combination UHF-VHF television tuner of the turret type in which some of the panels of the turret are for selecting UHF channels while others are for selection of VHF channels.

Still another object of the present invention is a UHF-VHF television tuner which employs a single crystal and/or a single harmonic generator for the selection of a plurality of UHF channels.

Still another object of the present invention is a UHF-VHF tuner combination in which the crystal mixer and/or the harmonic generator for UHF selection are disconnected when the VHF tuning panel is connected to the stationary circuit.

A further object of the present invention is a novel UHF panel which does not carry a mixer crystal.

Still another object of the present invention is a novel UHF panel which does not carry either the crystal mixer or the harmonic generator crystal.

Still another object of the present invention is a television tuner of the turret type using a single a strip for tuning an individual channel whether in the VHF or UHF range.

Still another object of the present invention is a turret type tuner having a novel and smaller structure.

A further object of the present invention is a frequency selector which can be assembled through a number of sub-assemblies.

Still another object of the present invention is an inexpensive low inductance stationary contact assembly.

Still a further object of the present invention is a UHF-VHF television tuner of the turret type which can be used for UHF reception with either single or double conversion as desired.

Still another object of the present invention is a UHF-VHF television tuner having a small number of movable contacts.

Still a further object of the present invention is a frequency selector having a balanced input connection independent of the balance or unbalance of the antenna tuned circuit.

Still a further object of my invention is to provide an input transformer such that the input balance is independent of the balance or unbalance of the output.

Still another object of my invention is to provide an input transformer suitable for the transmission of a wide band of frequencies.

Still another object of the present invention is to provide an input transformer which provides low frequency isolation of the antenna input terminals from the chassis.

Still another object of the present invention is a frequency selector having negligible oscillator radiation through the appropriate use of feed through capacitors in the input side.

Another and more specific object of the present invention is the drum for a frequency selector requiring a smaller number of components than previous types.

Another and more specific object of the present invention is the provision of means for reducing the number of supporting discs in the drum of a turret type frequency selector to two and the number of panels by one-half.

Still another object of the present invention is the provision of means whereby individual panels forming the drum of a turret type frequency selector can be easily mounted or removed from this drum.

A further and more specific object of the present invention is a stationary contact supporting plate particularly adapted for automatic insertion of the contacts.

Still another object of the present invention is the provision of means in a frequency selector of the discrete type for reducing the frictional force required for turning the drum of such frequency selectors.

Still another object of the present invention is the provision of novel stationary contacts obtainable from the conductive and resilient strips or ribbons.

Still another object of the present invention is the provision of means for reducing the stray coupling in a frequency selector and the provision of means for maintaining uniform selectivity at relatively high frequency and relatively low frequency channels.

The frequency selector of the present invention is mounted on a chassis and consists of a rotating drum, a stationary contact assembly, in addition to the components such as vacuum tubes mounted on the chassis proper. The drum of the present invention is formed by two supporting discs mounted on a shaft around the periphery of which are releasably secured tuning panels. In the present invention there is a single panel for each channel; the panel extending partly between the two supporting discs and partly beyond one of these discs in the axial direction. The section of the panel which is positioned between the two supporting discs serves to tune the oscillator and the mixer of this frequency selector, while the portion of the panel extending beyond one of these discs serves to tune the RF section. That is, an RF amplifier if there is one, or just a pre-selecting circuit.

One of the supporting discs, preferably the one not used for positioning the drum, is made of spring material so that the panels can be mounted in place or removed by a very simple operation. More specifically, after insertion in an indexing slot of the other disc pressure applied in the radial direction will cause each panel to slip in its proper position. When it is desired to remove a panel, it is only necessary to unlatch the panel from the spring disc and then move the panel in the radial direction.

The present frequency selector is also provided with a novel stationary contact assembly. This stationary contact assembly consists of insulated bases provided with aligned opening and shaped so as to permit automatic insertion of the stationary contacts which may be a portion of a conductive resilient strip or ribbon preloaded so that uniform contact pressure is obtained despite variations in the height of the different movable contacts mounted in the previously mentioned panels of the drum.

The stationary contact assembly, and there are two for each frequency selector, one for the oscillator converter section and the other for the antenna section, are mounted on a metallic chassis on which is also mounted input elements such as an input transformer, and a number of feed-through capacitors for connecting the stationary contacts to the circuitry mounted on the sub-chassis and from it to that mounted on the main chassis.

The use of feed-through capacitors is particularly important in that it will reduce oscillator radiation by providing appropriate by-passes for the RF. It was mentioned above that the stationary contacts consist simply of sections of a conductive and resilient strip. Their construction is such that the movable contacts mounted on the drum wipe the stationary contacts for shorter distances than in previous frequency selectors, thus reducing the total frictional torque needed for rotation of the drum without, however, reducing contact pressure.

In order to reduce the size of the frequency selector, it was necessary to reduce the number of contacts mounted on the panel. This was made possible by the novel use of a balanced to unbalanced transformer such that the input remains balanced independently of the balance or unbalance of the antenna tuned circuits.

In other words, the tuner of the present invention has a balanced input. Through the use of such a balanced input, the antenna section movable contacts are reduced from 6 to 4 with provisions too for a connection for a mixer crystal if the selector of the present invention is to be used also in a separate high frequency band; for example, the UHF band in the case of a television tuner.

When, in fact, the present frequency selector is to be used not only for VHF, but also for UHF, the drum is provided with a number of UHF strips or panels which carry tuning elements for the desired channel in the UHF range. Two embodiments are possible for such a UHF-VHF tuner. One uses single conversion from UHF down to the I.F. of the television receiver. The other first converts the UHF into a first I.F. in the VHF range and then converts the VHF signal into the I.F. of a television receiver. In both cases a mixer crystal is used for the conversion, in addition to a harmonic generator crystal which serves to increase the harmonic content of signals generated by the local VHF oscillator.

In the present frequency selector, the mixer crystal is mounted on the chassis and is therefore common to all the UHF strips, and the harmonic generator crystal may, as desired, be mounted on the UHF strip or on the chassis. When a UHF strip leaves engagement with a stationary contact assembly of the present frequency selector, the two crystals are disconnected and the tuner reverts to its operation as a VHF tuner.

Furthermore, the construction of one version of the present television tuner is such that the mixer crystal and the harmonic generator crystal can be removed from the chassis when desired, or in the reverse operation can be connected to the chassis when desired. The operation of the present frequency selector from the electrical standpoint is as follows: for VHF reception an input transformer changes the input signal from balanced to unbalanced and applies it through capacitors to the tuning elements of the antenna section which are mounted on the extension of a VHF channel. Tuned circuits for frequency selection are provided for both the input and also the output of the R.F. amplifier which may comprise either a pentode or a neutralized triode or a cascode circuit or any other R.F. amplifier operable in the VHF range. After the second selection at the output of the R.F. amplifier, the signal is applied to the mixer which may be one half of a double triode tube. At the same time, the local oscillator is tuned by the tuning element mounted on the oscillator converter section of the VHF panel so that the locally generated signals, when mixed with the R.F. signals, will produce at the output of the converter tube the desired intermediate frequency. The coupling between the output of the R.F. amplifier, the local oscillator and the converter is obtained through induction coupling of the coils mounted in the oscillator converter section of the VHF panel.

For UHF reception, as mentioned above, two possibilities exist. Considering first the double conversion method, the tuner is provided with two crystals. One crystal is used for producing a first I.F. signal; the second crystal for producing a UHF heterodyning signal. The UHF signal is applied to the balanced input of the present television tuner through the same transmission line of the VHF signals, but is now applied to the R.F. tuning circuits mounted on the UHF panel. As a result of the first conversion involving the mixer crystal and a generated harmonic of the oscillator crystal, a first intermediate frequency is obtained at the output of the mixer crystal. That intermediate frequency is practicably selected at a frequency intermediate the high and low VHF channels.

The UHF panel is also provided with tuning elements for predeterminately tuning the VHF local oscillator and converter tube. The output from the mixer crystal now at, say, 150 megacycles, is applied to this VHF converter so that at the output of it there will now appear a 40 or 20 megacycle signal, corresponding to the I.F. frequency of the television receiver.

The second possibility of UHF reception again requires the insertion of a mixer crystal and a harmonic generator crystal in the chassis of the present frequency selector. The UHF signal is here converted directly from UHF to the I.F. of the television receiver. The R.F. amplifier and converter tubes for the VHF operation are now tuned to the I.F. frequency by coils mounted on the UHF panel so that amplification at the intermediate frequency is obtained even before the signal is applied to the I.F. strip of the television receiver.

These and other objects of my present invention will become apparent on consideration of the following description when taken in connection with the drawings in which:

Figure 27A is a schematic diagram corresponding to

Figure 26:
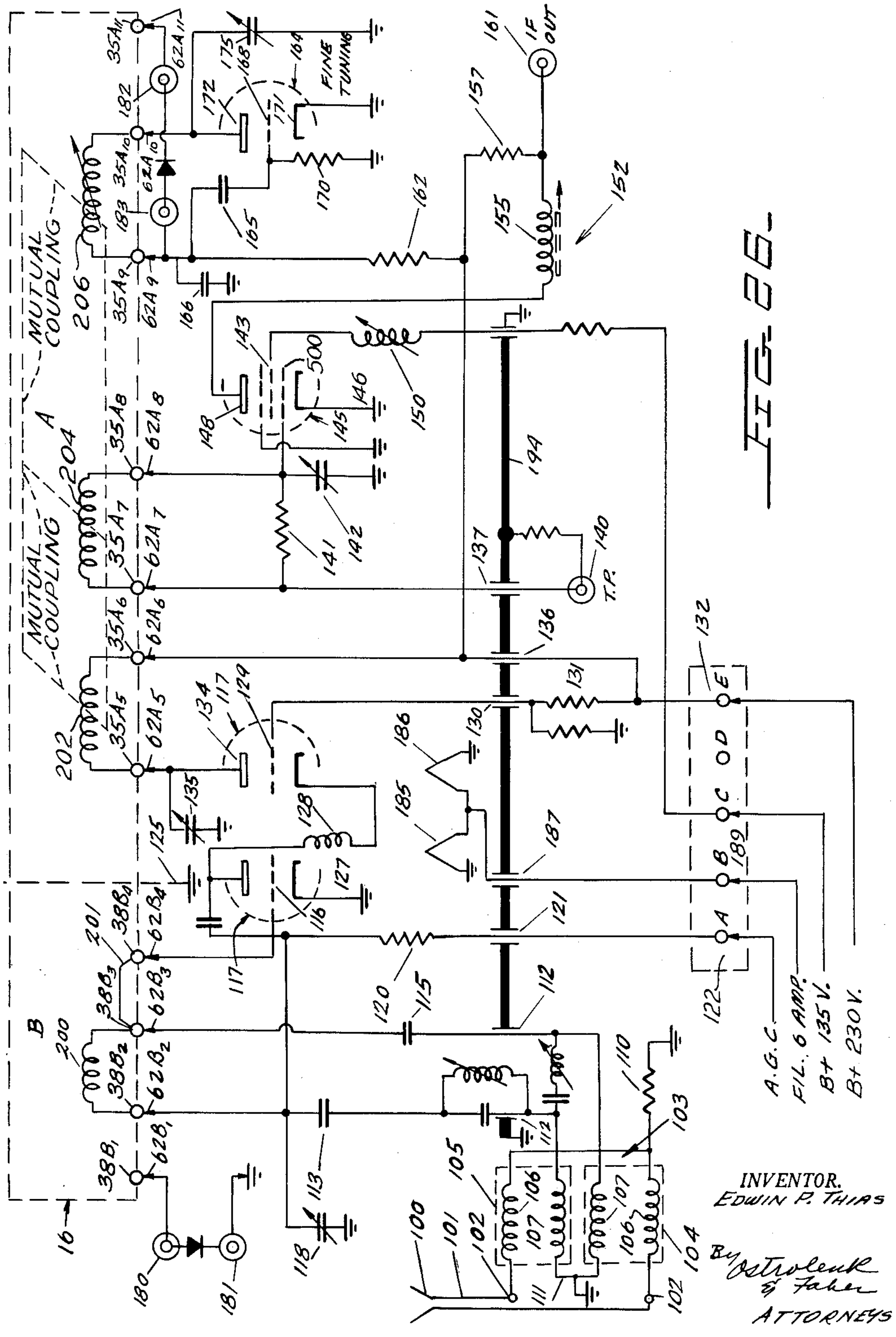
Figure 26 is a schematic diagram of a circuit arrangement of the tuner, with a VHF panel in circuital engagement therewith.
Figure 7A:
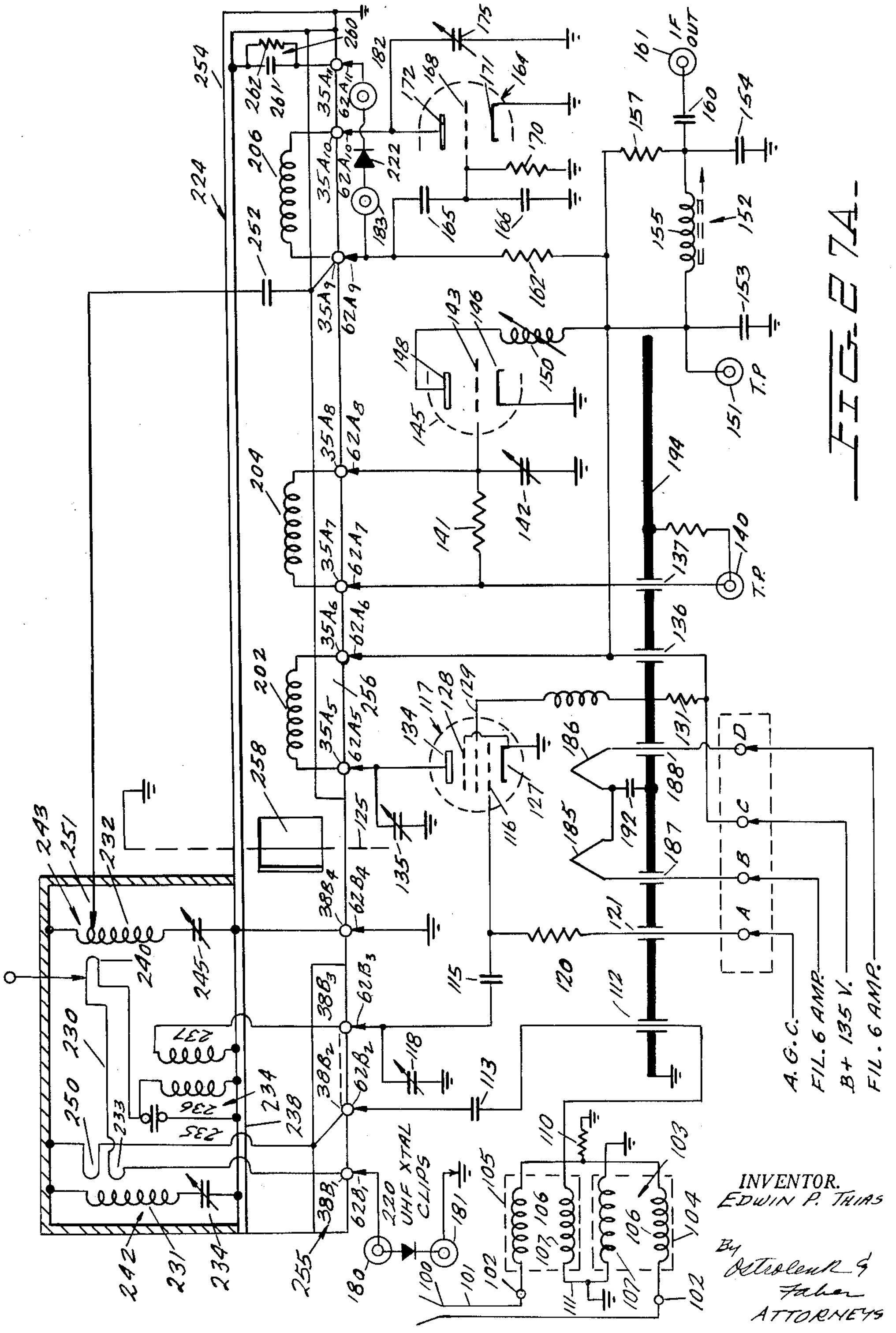

Figure 26 with a UHF panel in circuital engagement and showing the use of a low noise pentode stage as a first amplifier and using a triode mixer.

Figure 27B:
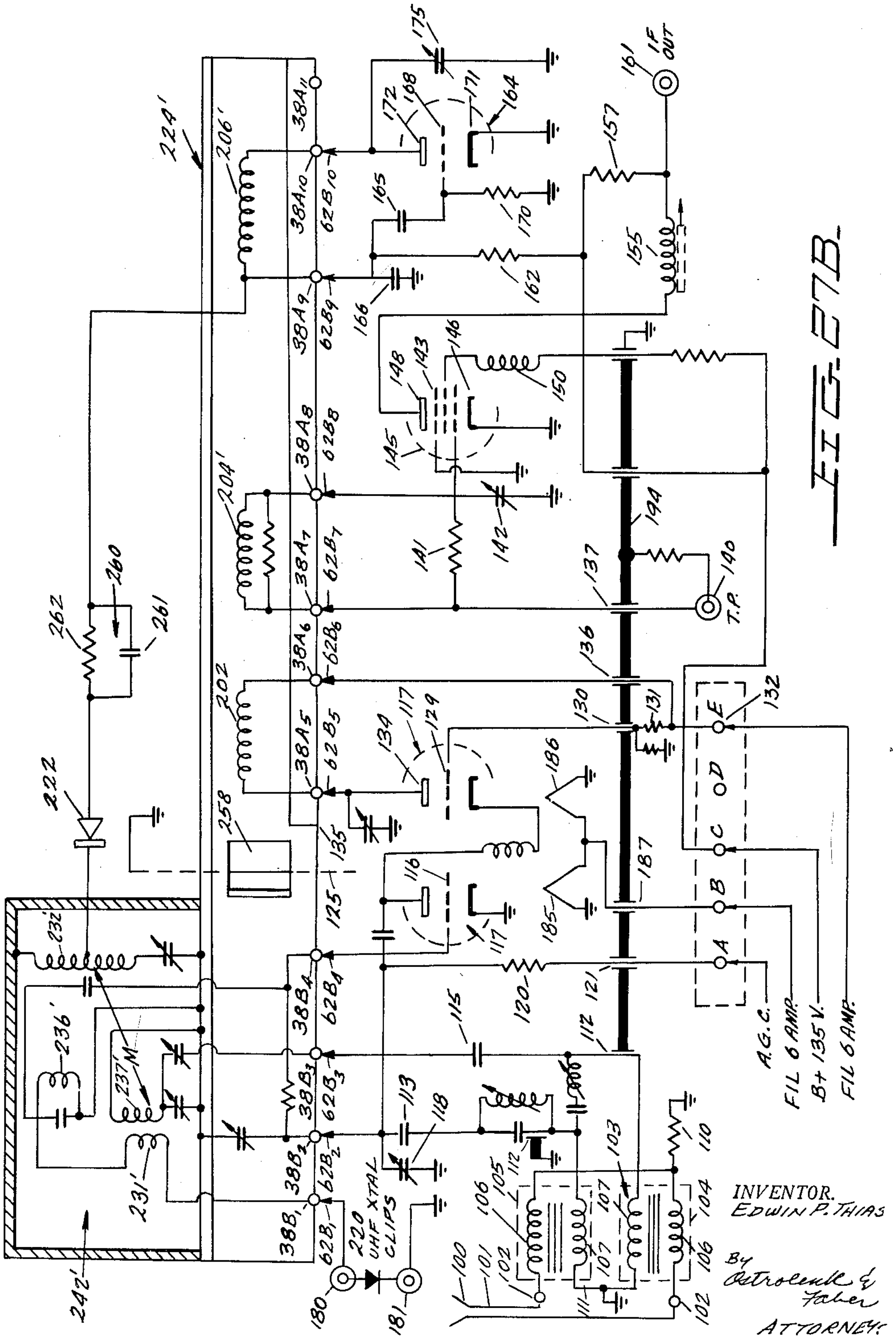

Figure 27B is a second embodiment of a UHF panel (now using a cascode circuit as the first amplifier and a pentode mixer) showing the harmonic generator crystal mounted on the panel.

Figures 28, 29, 30, 31, 32, 34:
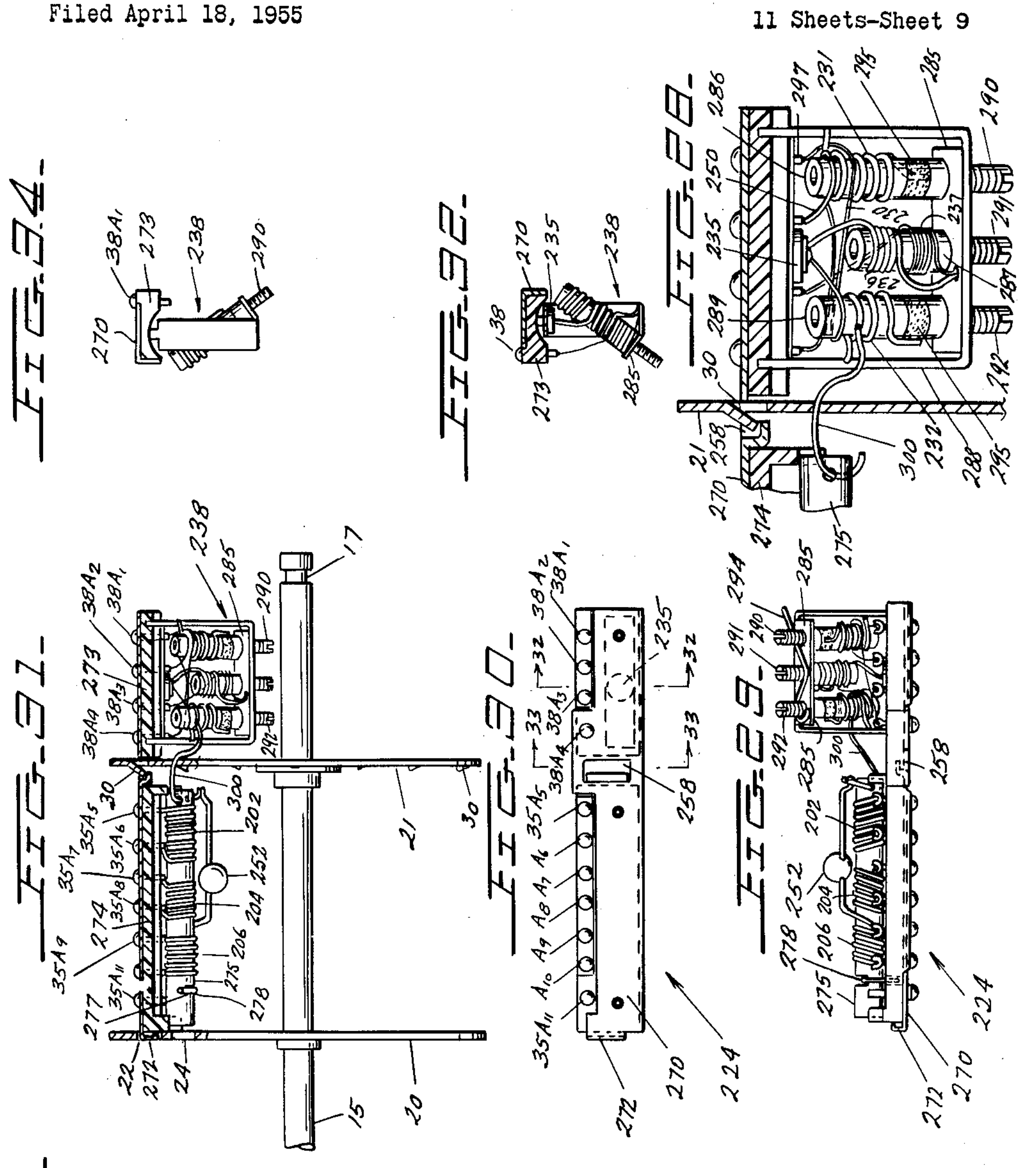

Figure 28 is an enlarged side view of the preselector portion of an exemplary embodiment of a UHF panel.

Figure 29 is a slide view of the whole UHF panel corresponding to Figure 28.

Figure 30 is a plan view of the UHF panel of Figures 28 and 29.

Figure 31 is a view of the opposite side of the UHF panel corresponding to Figure 29, shown assembled between panel mounting discs of the tuner.

Figures 32 to 35 are constructional views of coil elements of the UHF panel embodiment of Figures 28 to 31.

Figures 10, 11, 12, 13, 14, 15, 16, 17, 18, 19, 20A, 20B, 20C:
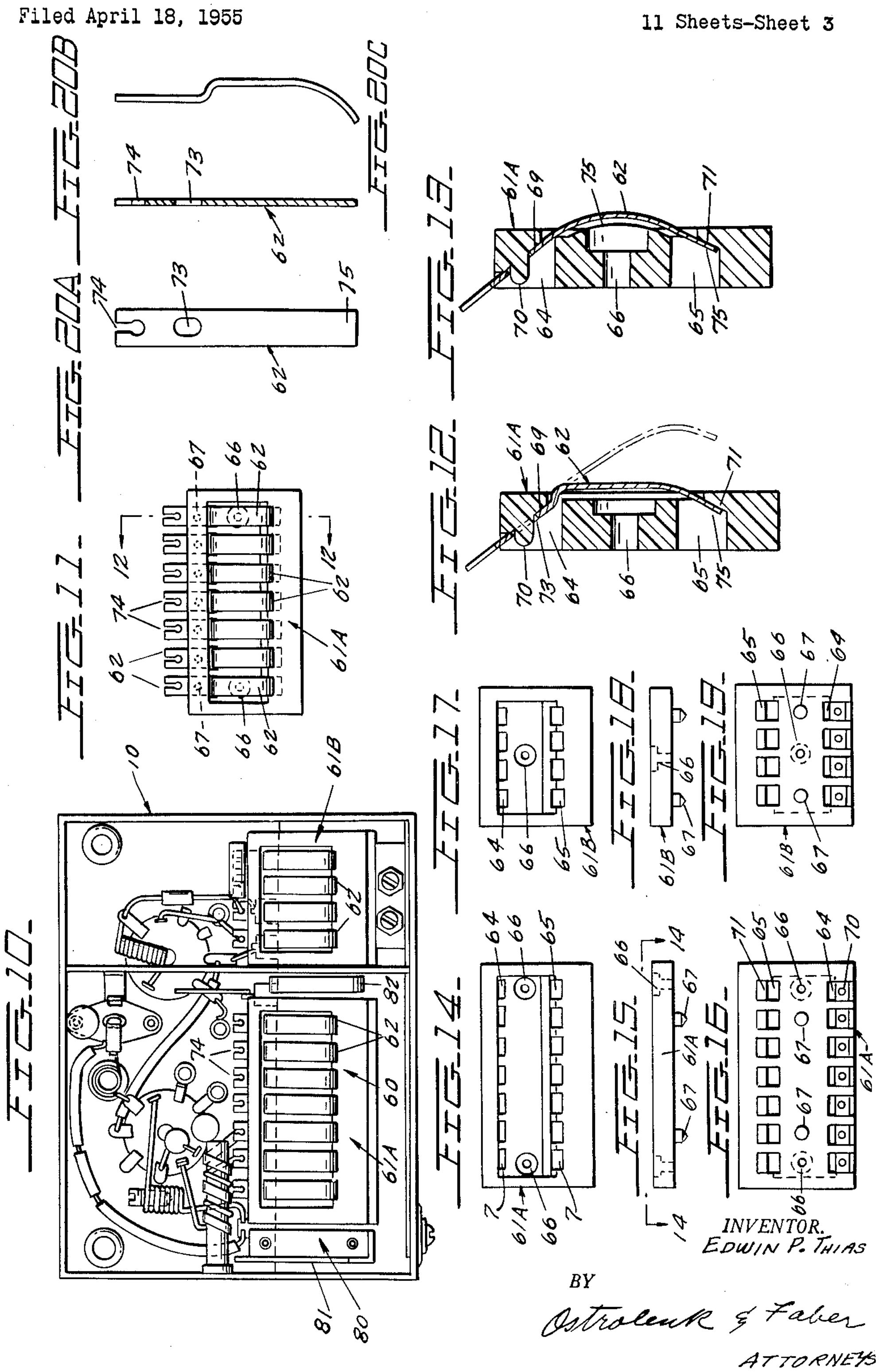
Figure 10 is a bottom view of the television tuner of the present invention.
Figure 11 is a bottom view of the stator assembly of the tuner of the present invention.
Figure 12 is a cross-sectional view of the stator assembly of Figure 11 taken along line 12—12 of Figure 11 and looking in the direction of the arrows.
Figure 13 is a modification of the stator assembly of Figure 11.
Figure 14 is a bottom view of the stator assembly panel of the present invention with the stationary contacts removed.
Figure 15 is a side view of the stator assembly panel of Figure 14.
Figure 16 is a top view of the stator assembly panel of Figure 14.
Figure 17 is a bottom view of the other stator assembly plate of the present invention with the contacts removed.
Figure 18 is a side view of the stator assembly plate of Figure 17.
Figure 19 is a top view of the stator assembly plate of Figure 17.
Figure 20A is a front view of one of the stationary contacts of the present invention.
Figure 20B is a cross-sectional view of the stationary contacts of Figure 20A.
Figure 20C is a cross-sectional view of a modified construction of the stationary contacts.
Figures 36, 37, 38:
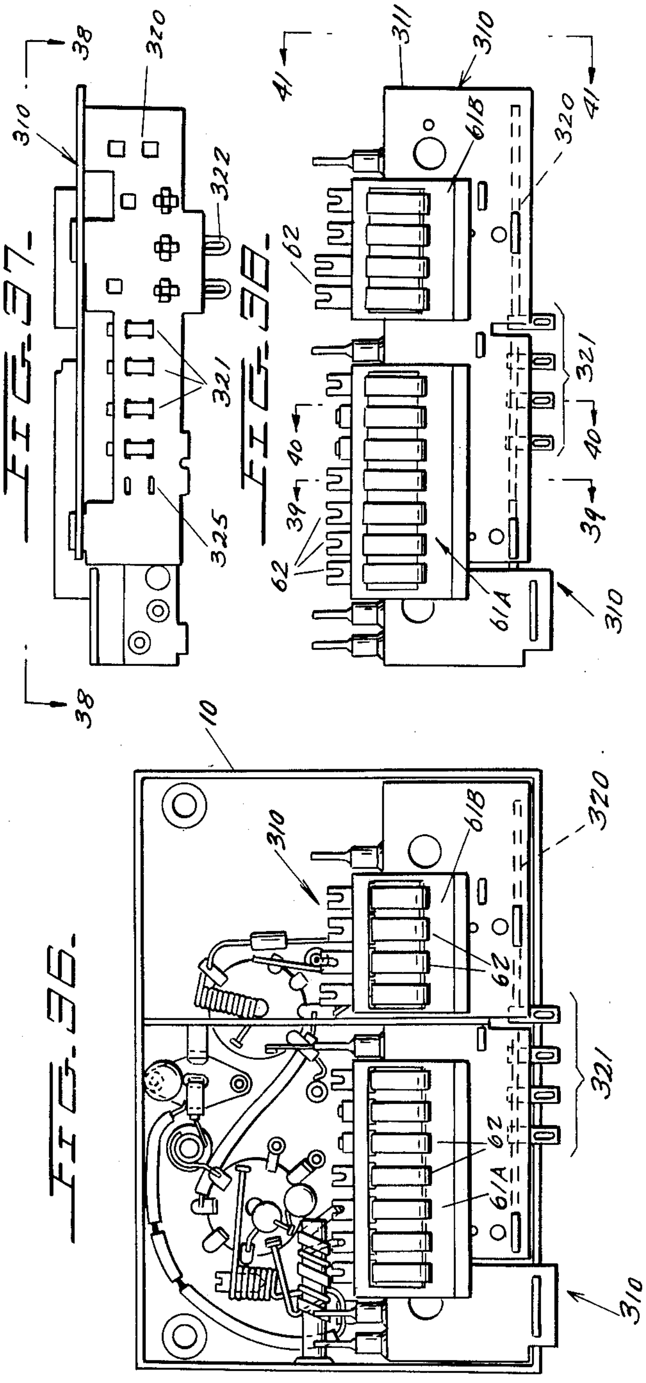

Figure 36 is the bottom view of a television tuner chassis, being a modification of the embodiment of Figure 10.

Figure 37 is a plan view of the stationary contact sub-assembly of the tuner of Figure 36.

Figure 38 is a side view of the contact sub-assembly of Figure 37.

Figure 39:
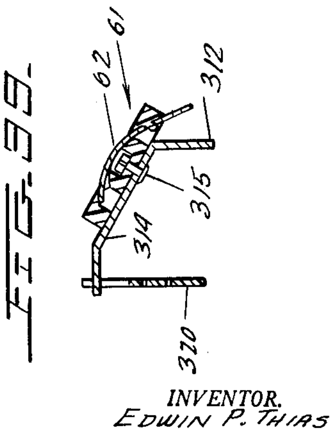

Figure 39 is a cross-sectional view through the contact sub-assembly of Figure 38, taken along the line 39—39 thereof.

Figure 40:
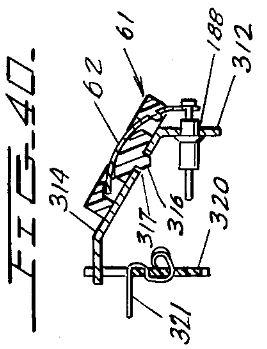

Figure 40 is a cross-sectional view through the contact sub-assembly of Figure 38, taken along the line 40—40 thereof.

Figure 41:
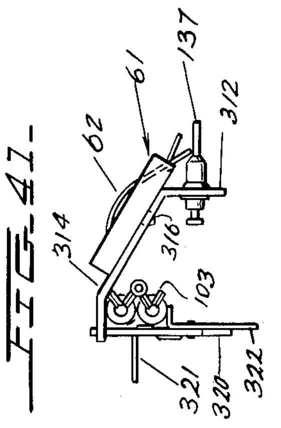

Figure 41 is an end view of the contact sub-assembly of Figure 38.

Figures 42, 43, 44, 45, 46, 47, 48, 49, 50, 51, 52:
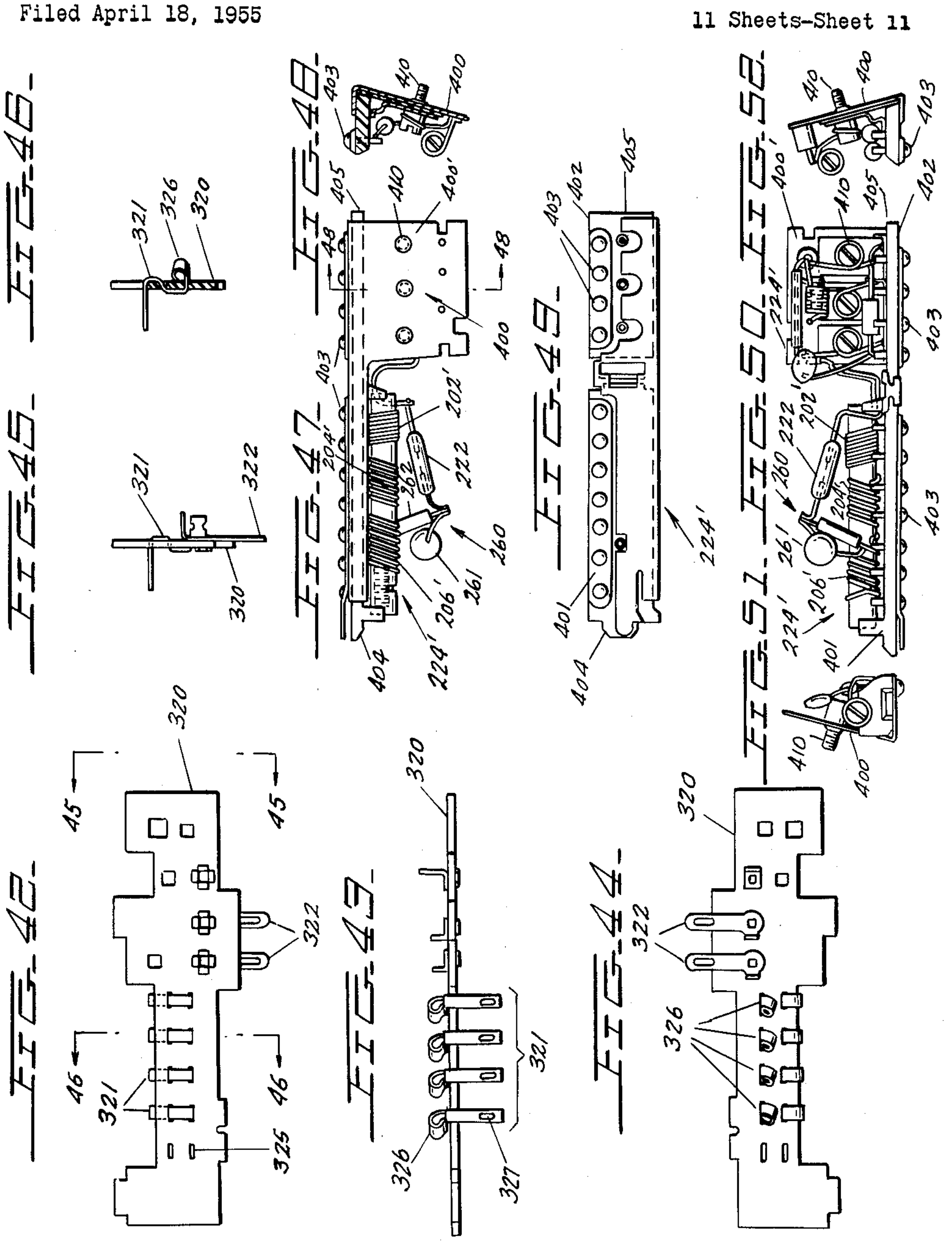

Figure 42 is a plan view of the dielectric section of the UHF panel shown in Figures 37 and 38.

Figure 43 is an elevational view of the section of Figure 42.

Figure 44 is a bottom view of the dielectric section of Figures 42 and 43.

Figure 45 is an end view of the dielectric section of Figure 42, as seen from line 45—45 looking in the direction of the arrows.

Figure 46 is a cross-sectional view through the dielectric section of Figure 42.

Figure 47 is a plan view in elevation of one side of a modified UHF panel.

Figure 48 is an end view in elevation as seen from the right end of the UHF panel in Figure 47.

Figure 49 is a top plan view of the UHF panel of Figure 47.

Figure 50 is a side elevational view of the UHF panel of Figures 47 to 49 showing the internal parts thereof and adjustments therefor.

Figure 51 is an end elevational view of the UHF panel of Figure 50 as seen from the left end.

Figure 52 is an end elevational view of the UHF panel of Figure 50 shown from the right end thereof.

Figure 1:
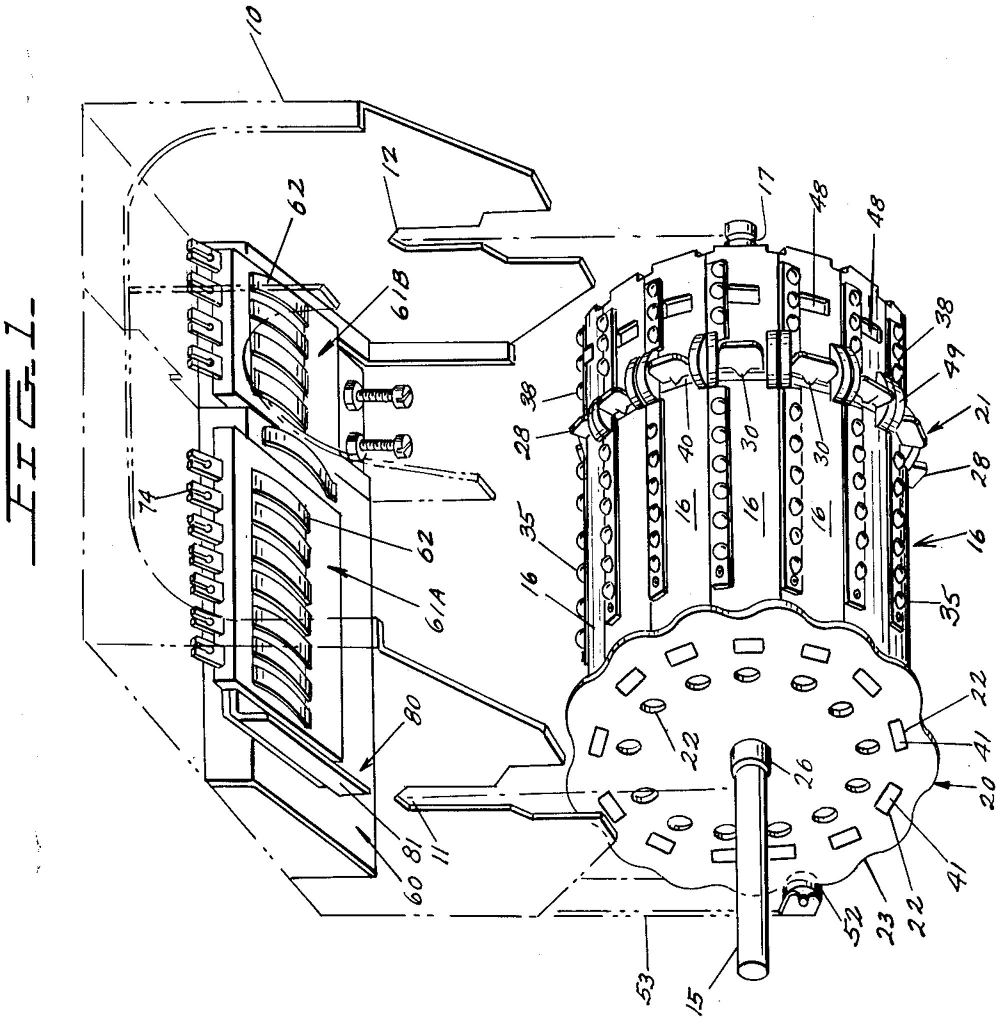
Figure 1 is an exploded view of the television tuner of the present invention.

Referring first to Figure 1, the television tuner of the present invention consists of a chassis 10 provided with appropriate bearings 11 and 12 at each end of chassis 10 for supporting shaft 15 of turret 16. Bearing 11 is dimensioned so that it can be engaged by shaft 15 in its forward portion. Bearing 12 has smaller dimensions than the cross-section of shaft 15 so that by engagement of a channel 17 of shaft 15 with bearing 12, shaft 15 and, therefore, turret 16 are positioned in the longitudinal direction.

Figures 2, 3, 4, 5, 6, 7, 8A, 8B, 9A, 9B, 9C:
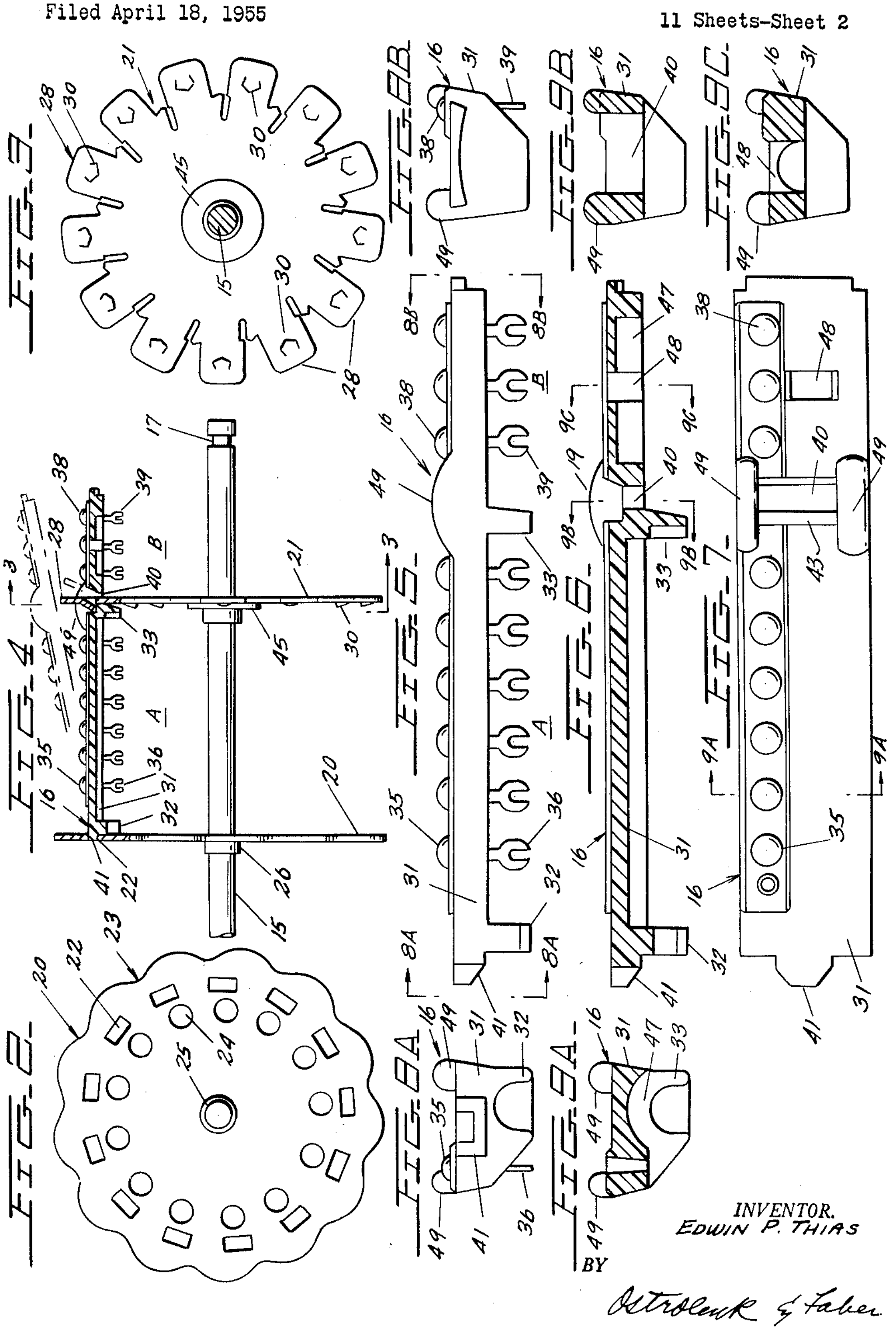
Figure 2 is a front view of one of the supporting discs of the turret of the present invention.
Figure 3 is a front view of the second disc of the turret of the present invention.
Figure 4 is a side view of the turret of the present invention showing only one panel in place and its position when disengaged from the disc of Figure 3.
Figure 5 is a side view of one of the panels of the present invention.
Figure 6 is a cross-sectional view of the panel of Figure 5.
Figure 7 is a top view of the panel of Figure 5.
Figure 8A is the end view of the panel of Figure 5.
Figure 8B is the other end view of the panel of Figure 5.
Figure 9A is a cross-sectional view of the panel of the present invention taken along line 9A—9A of Figure 7 and looking in the direction of the arrows.
Figure 9B is a cross-sectional view of the panel of the present invention taken along line 9B—9B of Figure 6 and looking in the direction of the arrows.
Figure 9C is a cross-sectional view of the panel of the present invention taken along line 9C—9C of Figure 6 and looking in the direction of the arrows.

Mounted on shaft 15 (see also Figures 2, 3 and 4) are two supporting discs 20 and 21. Figure 2 shows the front view of disc 20. Disc 20 is provided with circumferential notches 23. Disc 20 is also provided with openings 22 which, as described hereinafter, serve to engage the panels forming the drum of the present invention.

Positioned along the radii of disc 20 passing through the openings 22 are circular openings 24 which also, as described hereinafter, serve to provide a means to adjust the frequency of the local oscillator through adjustment of the inductance of the coils mounted on the panels.

Supporting disc 20 is also provided with a center opening 25 and a flange 26 (see Figure 4) through which disc 20 can be secured and welded to shaft 15. The other disc 21 shown in Figure 3 is made of spring material and is provided with a number of extensions 28, the number of these extensions corresponding to the number of panels, that is, to the number of openings 22 in disc 20. Extensions 28 are resilient and, as described hereinafter, serve to position the panels against both radial and circumferential motion of the panels. They are provided, in fact, with bend ups 30 which engage an appropriate opening in the panels as described hereinafter in connection with Figures 5, 6, 7, 8 and 9.

Referring now to Figures 5, 6, 7, 8 and 9, the panel 16 of the present invention consists of a dielectric base 31. Base 31 is a plastic molding and may be considered to be divided into two sections, sections A and B.

Section A is provided with two supporting arms 32 and 33 on which can be positioned the form of the inductive coil. Arms 32 and 33 are more clearly shown in Figures 6, 8 and 9. In Section A of panel 16 are six movable contacts 35 which extend through the base 31 of panel 16 to terminate with terminals 36.

Section B of panel 16 is the continuation of base 31 and is provided with three contacts 38 which also extend through the base 31 of panel 16 and terminate in terminals 39.

Base 31 as shown clearly in Figure 7 is also provided with an opening 40 for engaging one of the extensions 28 of end disc 21. The other end of section A of base 31 is provided with an extension 41 which is dimensioned so that it can engage opening 22 of disc 20, thus providing an interlock for panel 16 against both radial and circumferential movement of panel 16 with respect to disc 20.

As previously mentioned, panel 16 is provided with an opening 40 located between the two sections A and B. Opening 40 visible in Figures 6 and 7 is engaged by one of the extensions 28 of the second disc 21 when panel 16 is pushed rapidly down in the assembly process. When panel 16 has reached the lowest point, knock out 30 of extension 28 engages a platform 43 so that panel 16 cannot now be removed by the inverse operation.

To remove panel 16 it is now necessary to first bend extension 28 in a direction away from disc 20 until bend up 30 frees the platform 43. At this point panel 16 can be raised since knock-out 30 will now move through opening 40 of panel 16. Panel 16 can now be completely removed from the disc structure 20—21 by pulling it away from engagement with opening 22 of the first disc 20.

The second disc 21 is also provided with a flange or collar 45 through which disc 21 is secured, for example by welding, to shaft 15. Panel 16 is also provided as shown, for example, in section B of Figure 6 with a cylindrically shaped recessed portion 47 in which can be mounted the coil form and the appropriate coil. Opening 48 permits a securing device, for example a spring, to mount and secure the coil form to panel 16 in opening 47.

Panel 16 is also provided with raised portion 49 (see Figures 5, 6 and 7) having the function of reinforcing the weakest point of panel 16; that is, where opening 40 is located.

Figures 8A, 8B, 9A, 9B and 9C show end views, respectively, of panel 16.

Referring back to Figure 1, the panel 16 in cooperation with discs 20 and 21 form the turret shown in Figure 1. The front disc 20 engages a detent roller 52 biased by means of a spring 53 against one of the notches 23 of disc 20. Spring 53 is secured to the chassis 10 of the tuner.

Mounted on chassis 10 is metallic sub-chassis 60 (see Figures 1 and 10). Metallic sub-chassis 60 is attached to chassis 10 after all the necessary components have been mounted on sub-chassis 60.

Secured to sub-chassis 60, for example by means of rivets, are the two stationary contact assemblies 61. Stationary contact assembly 61A corresponds to the panel section A, while stationary contact assembly 61B corresponds to the panel section B. In other words, stationary contacts 62 of section A are engaged by movable contacts 35 of section A of panel 16, while the stationary contacts 62 of section B of stationary contact assembly 61 are engaged by the movable contacts 38 of section B of panel 16.

Stationary contact assembly 61A (see also Figures 14, 15, and 16) is a plastic molding, the top view of which is shown in Figure 14, the side view in Figure 15 and the bottom view in Figure 16.

As can be seen from Figure 14, there are two series of openings 7 in this particular embodiment along the length of molding 61A. These openings are referred to in Figures 14 and 16 by the numerals 64 and 65, respectively.

Molding 61A is also provided with opening 66 through which stationary assembly 61A can be riveted to the sub-chassis 60. Molding 61A is also provided with extensions 67 which serve to properly position molding 61A on sub-chassis 60.

Openings 64 of molding 61A are provided with sloping portions 69, each of which has a small finger 70. Openings 65, on the other hand, are provided with a shoulder 71. These elements are more clearly shown in Figures 12 and 13.

Referring first to Figures 20A and 20B, the stationary contacts consist of a flat conductive leaf spring 62 provided with an elongated opening 73. One end of flat spring 62 is provided with a bifurcation 74. Flat spring member 62 can be mounted on the molding 61A as shown in Figure 12, namely, member 62 is first inserted through opening 64 until its end 75 engages opening 65 and bears against the shoulder 71 of opening 65. Then opening 73 of element 62 will be in close proximity to finger 70 and now opening 73 can be made to engage the finger 70. The bifurcated end 74 extends beyond the end of molding 61A as shown in Figure 12.

Although a flat spring 62 is here shown, it may, if desired, be preformed as illustrated schematically at Figure 20C to permit greater flexibility in contour of the plastic member.

To clarify the mounting process, indicated in Figure 12 are the consecutive positions of element 62. These positions are shown dotted from the first insertion of element 62 in opening 64 to the final position of element 62 in molding 61A.

Figure 13 shows a modification of molding 61A in that in Figure 13 molding 61A is provided with a slightly curved portion 75 which does not permit element 62 of spring material to be bent too much under the pressure of the movable contacts.

Figure 11 shows the complete stationary contact assembly 61A with all the seven stationary contact members 62 in position. It should be noted that the ends 74 of contacts 62 are connected to the necessary circuit elements of the tuner.

Figures 17, 18 and 19 show the second molding 61B which is basically similar to molding 61A except that molding 61B has provision for only four stationary contacts. Molding 61B is also secured to sub-chassis 60 by means of rivets or any other appropriate means.

Also mounted on the molding 61A is a metallic angle 80, one portion 81 of which serves as one of the plates for a variable capacitor, for example the fine tuning capacitor of this television tuner.

Figures 23, 24, 25:
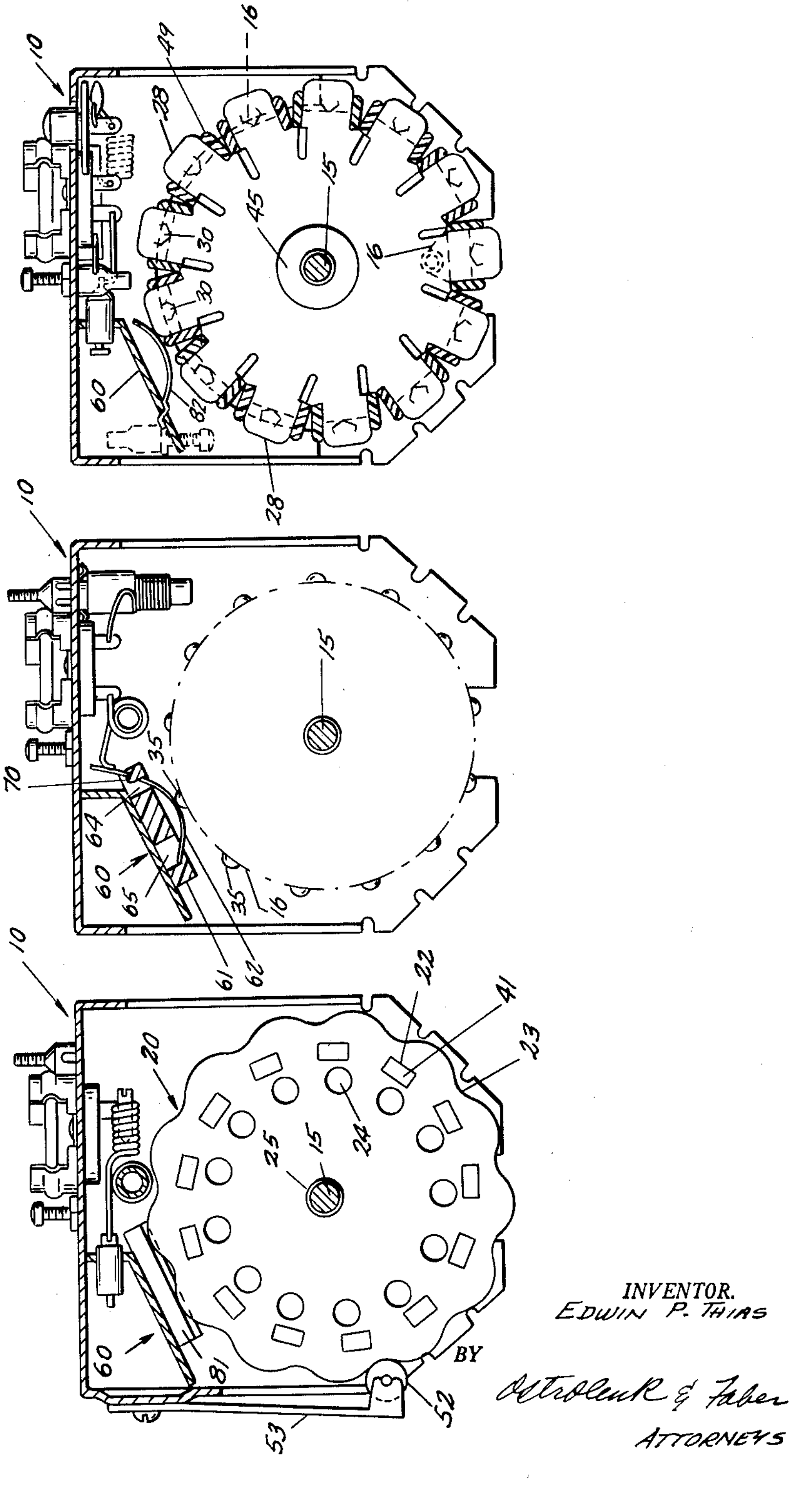
Figure 23 is a cross-sectional view of the turner of the present invention taken along line 23—23 of Figure 22 looking in the direction of the arrows.
Figure 24 is a cross-sectional view of the tuner of the present invention taken along line 24—24 of Figure 22 looking in the direction of the arrows.
Figure 25 is a cross-sectional view of the tuner of the present invention taken along line 25—25 of Figure 22 looking in the direction of the arrows.

Secured to sub-chassis 60 is also another spring member 82 which as shown in Figure 25 serves to wipe against the extensions 28 of the second supporting disc 21 to provide the necessary ground, thus producing a shield between the two sections A and B of the present television tuner.

Figure 23 shows the front end of the present tuner. Visible in Figure 23 are the detent mechanism, the tube socket, for example in this case the oscillator tube socket, the sub-chassis 60, and the previously mentioned plate 81 for the fine tuning capacitor.

Figure 24 is a cross-section showing the engagement of a movable contact 35 of section A of panel 16 with a stationary contact 62 of stationary contact assembly 61A.

Figure 22:
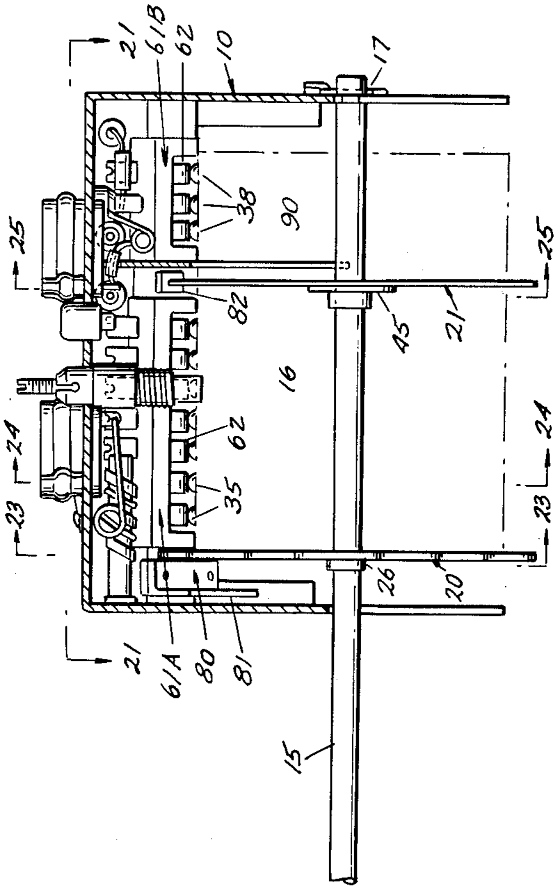
Figure 22 is a cross-sectional view of the chassis of the television tuner of the present invention showing the engagement between the stationary and movable contacts.

Referring now to Figure 22, it should be noted that since section A is the oscillator converter of the present tuner while section B is the antenna section of the present tuner, appropriate shielding between the two sections is provided not only by the second disc 21 engaging spring member 82 but also by stationary cooperating shield 90 which is almost complementary in shape to disc 21. This is necessary to reduce oscillator radiation to the limits set by the F.C.C.

Figure 21:
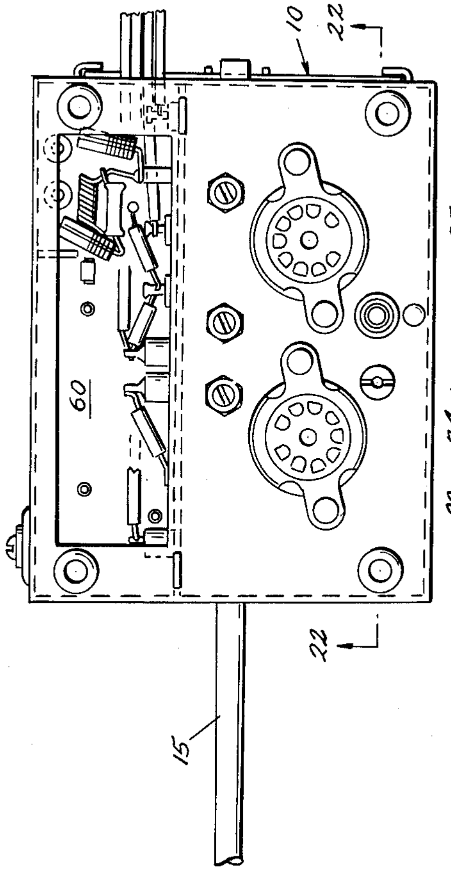
Figure 21 is a top view of the television tuner chassis of the present invention.

Figure 21 is a top view of the television tuner embodiment showing the different components which are mounted on the metallic sub-chassis 60. It should be noted again that all these components are mounted on sub-chassis 60 before sub-chassis 60 is permanently secured to the main chassis 10.

Referring now to Figure 26 showing the schematic circuit diagram for the present invention and more particularly showing a VHF strip or panel 16 with its tuning elements in engagement with the stationary contacts 62, the VHF-UHF antenna 100 is connected through a balanced transmission line 101 to the input terminals 102, 102 of the exemplary frequency selector. Connected to terminals 102 and mounted on the sub-chassis 60 is the input transformer 103 which transforms the balanced input signal into a signal which may be balanced or unbalanced or have any degree of balance and which is then applied to the control grid of the R.F. amplifier as described hereinafter.

Input transformer 103 consists of a pair of ferrite elements 104 and 105 cylindrically having windings through the axial openings to form the primaries 106 of the balanced to unbalanced transformer 103 and the secondaries 107 of the same transformer 103.

It should be noted that primaries 106 are connected together, and the terminal on the other side of input terminals 102 are grounded through a high resistance resistor 110. The secondaries 107 are also connected together on one side at 111 and then grounded. One of the windings 107 is connected through a coupling capacitor 115 to stationary contact $62B_3$ and the second secondary 107 is connected through the coupling capacitor 113 and from there to stationary contacts $62B_2$. Stationary contact $62B_4$ is connected to the grid 116 of the first triode 117 of a cascode circuit similar to that shown in application Serial No. 211,959. Although a cascode circuit is here shown in the amplifier circuit, it will be understood that any well known television tuner amplifier such as a pentode amplifier circuit may be used.

Stationary contact $62B_2$ is grounded through the variable capacitor 118. The cascode of the first triode is coupled through a coupling capacitor and resistor 120 and through feed through capacitor 121 to terminal 122 to which the desired A.G.C. voltage may be applied when the present frequency selector is mounted in an appropriate utilization device such as a television receiver.

In Figure 26 there is also shown a dotted line 125 grounded. The dotted line 125 represents the dividing shields between the antenna section represented by contacts $62B_1$, $62B_2$, $62B_3$, $62B_4$ and the oscillator converter section corresponding to stationary contacts $62A_5$ to $62A_{11}$.

The cathode 127 for amplifier tube 117 is grounded.

The anode of the first triode of the cascode circuit is connected through an inductance of few turns to the cathode of the second triode of the cascode circuit. Although here illustrated as two tubes, these are in the present practice all confined within one envelope and called a 6BQ7A.

Plate 134 of the second triode 117 is connected to stationary contact 62$A_5$ and is connected to ground by means of trimming capacitor 135. Also connected to terminal 132 through a feed-through capacitor 136 is another stationary contact 62$A_6$. Stationary contact 62$A_7$ is connected through a feed-through capacitor 137 to a test point 140. Also connected to stationary contact 62$A_7$ is a resistor 141. The other side of resistor 141 is connected to stationary contact 62$A_8$. This end of resistor 141 is also connected to ground through a trimming capacitor 142. The same end of resistor 141 is further connected to the grid 500 of mixed tube 145.

Cathode 146 of converter tube 145 which is a 6AT8 pentode is connected to ground. Screen grid 143 of tube 145 is connected through an appropriate coil 150 to a second tap point 151. Plate 148 is connected through inductance 155 to the I.F. output.

At terminal 161 during the proper operation of the present frequency selector will appear the desired signal at the correct intermediate frequency. Connected to terminal 161 is a resistor 162. Resistor 162 is connected to the stationary contact 62$A_9$ and to two capacitors 165 and 166. Capacitor 165 is connected to grid 168 of oscillator tube 164 and to ground through a grid leak resistor 170.

Cathode 171 of oscillator tube 164 is connected to ground. Plate 172 of oscillator tube 164 is connected to stationary contact 62$A_{10}$ and to ground through a variable capacitor 175 which is described hereinafter operates as the fine tuning capacitor for the present frequency selector, that is, the capacitor which permits through its variation relatively small frequency changes in the oscillator tube 164, thereby permitting a continuous adjustment in the frequency of oscillator tube 164.

It should be noted that in addition to the above described stationary contacts, the chassis of the present invention is provided with stationary contact 62$B_1$ connected to a terminal connector 180. The chassis is also provided with stationary contact 62$A_{11}$ connected to another stationary connector 182.

Thus, as will be described hereinafter in connection with Figures 27A and 27B showing the present frequency selector adjusted for UHF reception, it is possible to connect a UHF crystal mixer between connectors 180 and 181 and a UHF frequency multiplier or harmonic generator between terminals 182 and 183.

Filament 185 of tube 117 and filament 186 of tube 145—164 are connected in parallel and across the filament supply through feed-through capacitor 187, which in turn is connected to terminal 189. For the proper operation of the present frequency selector, the filament supply must be applied to terminal 189.

When as shown in Figure 26 it is desired to receive a VHF channel, then a VHF panel 16 is positioned so that its movable contacts 38$B_2$—38$B_4$ and 35$A_5$ to 35$A_{10}$, engage, respectively, the stationary contacts 62$B_2$—62$B_4$ and 62$A_5$—62$A_{10}$, as shown in Figure 26.

VHF panel 16 is provided with four tuning coils. The first 200 is connected between movable contacts 38$B_2$ and 38$B_3$ with a lead 201 connecting movable contact 38$B_3$ to 38$B_4$. Coil 200 is the only coil mounted in the antenna section of VHF panel 16.

Mounted on the oscillator converter section, that is section A, of panel 16 are three coils, a first one 202 connected between movable contacts 35$A_5$ and 35$A_6$. A second coil 204 is connected between the movable contacts 35$A_7$ and 35$A_8$, and coil 206 is connected between movable contacts 35$A_9$ and 35$A_{10}$.

It should be noted that as indicated in Figure 26 the inductance of coil 206 is made variable by the provision of an appropriate slug movable in the interior of coil 206 as well known in the art.

When the movable contacts of VHF panel 16 engage their respective stationary contacts and the appropriate voltages are applied to the present frequency selector, then the following conversion takes place.

A VHF signal picked up by antenna 100 is selected through coil 200 at the input of the first cascode amplifier tube 117. This signal appears amplified across coil 202 which is in the output circuit of the second cascode amplifier tube 117. At the same time oscillator tube 164 is oscillating at the desired frequency because of the insertion of coil 206 in its plate to grid circuit.

Mixer tube 145 is also provided with a tuned circuit, the inductance of which is represented by coil 204. Coils 202, 204 and 206 are mutually coupled to each other so that conversion can take place in tube 145, and the desired I.F. signal now appears between I.F. terminal 161 and ground.

Referring next to Figure 27A showing the present frequency selector connected for operation in a higher frequency band, for example the UHF band of the television spectrum, it will be noted that the stationary circuit of the frequency selector when operating in this UHF band is essentially the same as the one described in connection with Figure 26, except that now a low noise pentode stage is used as the first amplifier and two crystals are added to the circuitry; a mixer crystal 220 between the clips 180 and 181 and a harmonic generator crystal 222 between clips 182 and 183.

The changes in circuitry needed for UHF reception are obtained by causing a UHF panel 224 to come into engagement with stationary contacts 62A and 62B. More particularly, movable contact 38$B_1$ is now in engagement with stationary contact 62$B_1$ so that crystal 220 is now connected between movable contact 38$B_1$ and ground. Movable contact 38$B_1$ which is mounted on panel 224 as hereinafter described in connection with Figure 26 is connected to windings 233 and 240. Winding 233 is mutually coupled to preselector coil 231, thus providing the coupling between the mixer crystal 220 and the preselector coil 231.

Winding 240 serves to provide the necessary coupling between the harmonic generator coil 243 and the mixer crystal 220 through coupling winding 233. Winding 233 is connected to a parallel tuned circuit 234 consisting of capacitance 235 and inductance 236 tuned to the first intermediate frequency of the present frequency selector, for example a frequency in the range between 100 and 160 megacycles.

The above is necessary when the frequency selector of the present invention uses double conversion to obtain at its output the desired television receiver intermediate frequency, in other words, when UHF signals are demodulated twice to reach the lower level of the television receiver intermediate frequency.

Tuned circuit 234 is mutually coupled to inductance 237 which is coupled thru capacitor 115 to grid 116 of first amplifier stage 117.

Coil 243 is provided with a tap 251 which is connected to movable contact 38$A_9$ in engagement with stationary contact 62$A_9$. It should be noted at this point that UHF panel 224 consists of essentially a metallic base 254 as described hereinafter in connection with Figure 28 and insulating bases 255 and 256 where movable contacts 38$B_1$ to 38$B_3$ are mounted on the insulating base 255 while movable contacts 35$A_5$ to 35$A_{11}$ are mounted on the insulating base 256.

Movable contact 38$B_4$ is mounted on the previously mentioned metallic base 254 since it provides one of the necessary grounds for the metallic sub-chassis 238 mounted on the UHF panel 224. UHF panel 224 in its metallic base 254 is provided with an opening 258 which is similar to the previously described opening 40 as shown in Figures 6 and 7.

When UHF panel 224 is mounted to form the turret panel 16 of the present frequency selector, opening 258 is engaged by one of its spring arms 28 of disc 21. Since spring arm 28 is part of the metallic disc 21 and the metallic disc 21 is secured to shaft 15, spring disc 21 will be grounded and provide a shielding action between the two sections A and B of the present frequency selector as indicated by the dotted line in Figure 27 shown connected to ground.

Section A of UHF panel 224 carries basically three coils corresponding to the VHF coils 202, 204, 206. In fact, when the present frequency selector is used for double conversion, coils 202, 204, 206 of UHF panel 224 are selected to be tunable in the VHF range, more specifically at a frequency between 100 and 150 megacycles.

The function of these three coils 202, 204 and 206 is the same as described in connection with Figure 26, and their respective connections are, therefore, maintained.

It should be noted, however, that in the embodiment of Figure 27A, coil 206 of the local oscillator tube 164 is now also connected through contacts $35A_9$ and $62A_9$, to one side of the harmonic generator crystal 222. This end of oscillator coil 206 is also connected as mentioned above in connection with the description of Figure 26 to the grid 168 of oscillator tube 164 through the coupling capacitor 165.

The other side of the harmonic generator crystal 222 is connected to connector 182 which in turn is connected to the stationary contact $62A_{11}$ now in engagement with the movable contact $35A_{11}$. Movable contact $35A_{11}$ connects to one end of an R.C. circuit 260 consisting of capacitor 261 and resistor 262 connected in parallel and which is grounded on the other end.

It should be noted that as previously mentioned movable contact $35A_9$ which is connected to the oscillator coil 206 is also connected through capacitor 252 to a tap 251 of the harmonic generator coil 243.

It is now possible to describe the operation of the present frequency selector when used in a high frequency band such as the UHF band of the television spectrum.

The UHF signal is picked up by an appropriate antenna and through a transmission line of the balanced type to the input transformer 103. Transformer 103 which was described previously in connection with Figure 26 transforms a balanced incoming signal into an unbalanced one and through the coupling capacitor 113 applies it to coil 250 which is coupled to the coil 233. Also coupled to coil 233 is coil 243.

The incoming signal through coil 233 is applied to the UHF crystal mixer 220. The oscillator signal is applied through coils 240 and 233 also to crystal mixer 220, the resulting first I.F. signal being selected by tuned circuit 234.

Thus, there will now appear the desired signal at a lower frequency, for example 150 megacycles. This first I.F. signal is applied to the pentode amplifier 117 and then through coupling between coils 202 and 204 to the second mixer 145. Also applied to the second mixer 145 is the signal from the local oscillator tube 164. The coupling between the oscillator tube 164 and the mixer tube 145 occurs through mutual coupling of coils 204 and 206.

The output of mixer tube 145 is a tuned circuit across which, and more particularly at terminal 161, will appear the desired signal at the second intermediate frequency which corresponds to the intermediate frequency of the television receiver, for example approximately 40 or 20 megacycles.

It was previously mentioned that the local oscillator signal is applied to harmonic generator coil 222. Actually, the local oscillator 164 is connected at its output to the harmonic generator crystal 222 which will produce signals of harmonic frequencies, one of which is selected by a coil 243. The signal is applied to coil 240 in this particular example through the mutual coupling between coils 243 and 240.

It should be noted that in order to get the proper injection current at UHF, the R.C. circuit 260 was found to result in the best operating conditions in one embodiment of the present invention.

The constructional details of UHF panel 224 are more clearly shown in Figures 28, 29, 30, 31, 32, 33, 34 and 35.

UHF panel 224 consists of a metallic base 270 having an opening 258 for mounting on the supporting disc 21 as also described in connection with Figures 4 and 5. In the case of VHF panel 16, metallic base 270 is further provided with an extending portion 272 which serves for engaging an appropriate opening 22 in the other disc 20.

Mounted on the metallic base 270 are two portions of plastic moldings 273 and 274. On molding 274 is mounted a coil form 275 carrying coils 202, 204 and 206. Coil form 275 is also provided with an opening 277 engaged by a wire spring 278. It will be noted that coil form 275 is supported on molding 274 through end arms or projections such as 280 shown in Figure 35.

Figure 35:
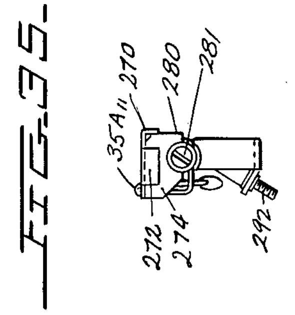

As also seen in Figure 35 engaging wire spring 278 is a trimmer screw 281 which can be moved in the interior of coil form 275 in proximity to oscillator coil 206 to vary the inductance of oscillator coil 206 and thereby the frequency of oscillation of oscillator tube 164. Also shown in Figure 31 is the coupling capacitor 252 which as previously mentioned in connection with Figure 27A serves to couple the signal from harmonic generator crystal 222 into the tuning coil 232.

It should be noted that this whole section comprising molding 274 is positioned between the discs 20 and 21. Furthermore, molding 274 as seen in Figure 30 extends also through part of the lower surface of base 270 to permit the mounting of the appropriate UHF contacts $62A_5$ to $62A_{11}$ on molding 274. The other molding section 273 serves to carry mounted thereon the UHF sub-chassis 238.

UHF sub-chassis 238 consists essentially of a rectangular support 288 Figure 28 made of conductive material having a bent portion 285 on which are mounted dielectric stubs 286, 287 and 289. Dielectric stubs 286, 287 and 289 are secured in any appropriate way to the bent portion 285 of the metallic support 288.

Each of the stubs 286, 287 and 289 is further provided with a screw of conducting material 290, 291 and 292, respectively, which engage appropriate openings (not shown) in the bent portion 285 of the rectangular support 288.

Cylinder 286 is provided with a plating 295 which acts as one plate of the variable capacitor 244 (see Figure 27A). The other plate of capacitor 244 is screw 290 which is then grounded through the bent portion 285 of the rectangular support 288. Thus, motion of screw 290 with respect to dielectric cylinder 286 will produce a variation in the capacitance of capacitor 244.

Wound on the remaining portion of the cylinder 286 is a preselector coil 231 (see also Figure 27A). Also visible in Figure 28 is the loop 230 and the input winding 250 which are coupled to the preselector coil 231. Wound on dielectric cylinder 287 are the first I.F. coils 236 and 237. Coil 236 has one end connected to capacitor 235 which as shown in Figure 28 is of the disc type. Capacitor 235 has one plated surface secured and in direct engagement with the bottom portion 297 of the metallic support 288.

Dielectric cylinder 289 is also provided with a conductive portion 299 which together with the dielectric cylinder and the conductive screw 292 constitutes the variable capacitor 245 which is in series with the harmonic generator coil 232 wound on coil form 289.

As seen in Figure 28, connected to coil 232 at an appropriate tap point is a lead 300 which is connected to the coupling capacitor 252. As mentioned in connection with Figure 27A, coupling capacitor 252 couples the output from the harmonic generator crystal 222 into the frequency selective circuit 243.

Figure 33:
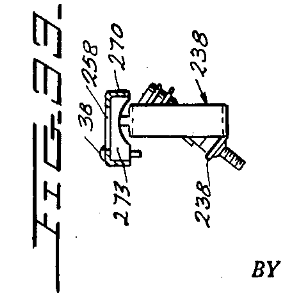

Figures 32, 33 and 34 show more clearly the position of the dielectric cylinders 286, 287 and 289. In particular it will be seen from these figures that by mounting dielectric cylinders 286, 287 and 289 with their respective screws 290, 291 and 292 on the bent portion 285 of the rectangular support 288, it becomes possible for the serviceman to make the necessary adjustments even after the panel 224 is mounted in the turret through discs 20 and 21 as shown in Figure 31.

It was previously mentioned that dielectric cylinder 287 is also provided with an adjusting screw 291. Adjusting screw 291 serves to vary the inductance of coil 236 so that it will tune to the desired frequency, that is, the first I.F. of the present television tuner.

In the above I have described one form the UHF panel may take. Figure 27B is a preferred modified version of the circuit diagram of the tuner embodying the UHF panels. In this exemplary embodiment, the diode crystal 222 is incorporated in each of the UHF panels 224 for the particular UHF reception therewith. Also, the trap 260 comprises condenser 261 and resistor 262 is placed in conjunction with the crystal 222 in the UHF section as shown in this Figure 27B. The remaining portions of the circuit bearing similar numerals are the same as the projections in Figure 27A and function in the manner as described hereinabove. Figure 27B is shown using a cascode amplifier as the first stage.

The coil sections and the UHF condenser sections within the shielded section 242 embody coils coupled as shown and in a form different from the coupling loops corresponding to 230, 240, 250 of Figure 27A. The coils 231' and 232' are similar to the same numbers unprimed coils in the version of the 242 section and arranged with mutual coupling ($m$) and condensers in a simplified manner.

Reference is made to Figures 47–52 and a physical exemplary embodiment of the UHF panel corresponding to panel 224' of this Figure 27B, hereinafter.

Figures 47–52 illustrate a physical embodiment for the UHF panel 224' for the tuner herein corresponding to the schematic showing thereof in Figure 27B. A metallic segment 400 comprises the structural body panel 224'. Two dielectric panels 401, 402 are carried by the metallic structure 400 in a longitudinal arrangement to constitute the UHF panel as is clearly shown in these figures. The dielectric segments 401, 402 carry the contact pins 403 for connection with the tuner circuitry mounted in the chassis and against the springs as will be understood.

The end projection 404 of panel 401 is for mounting in corresponding segment openings in the turret body; as is truncated end 405 of panel 402. The crystal 222 is supported by its end wire in the circuit within the panel framework. The trap 260 comprises condenser 261 and resistor 262 is similarly supported with the crystal 222. The mixer and oscillator coils 202', 204' and 296' correspond to the coils shown in Figure 27B. The tunable UHF section of panel 224 is mounted on the extending portion 400' of panel 400 projecting from the panel. Three low-loss metal screws 410 are provided for the adjustment of the inductances in the circuit 242'. Adjustment of the strip to a predetermined UHF channel frequency band is readily made before insertion of the panel 224' in the turret segment of the tuner. Thus, whenever the tuner turret is angularly positioned to the corresponding television channel, a predetermined UHF channel is pretuned and in operation for reception of the selected UHF channel, suitably heterodyned and connected to the tuner output for the television intermediate frequency section.

Referring now to Figure 36 which shows the bottom view of the chassis of the present invention, it will be seen that the chassis of Figure 36 is a modification of the chassis described in connection with Figure 10. As seen in Figure 36, mounted on the metallic chassis 10 of the present television tuner in the sub-assembly 310 shown in detail in Figures 37 and 38 with cross-sections in Figures 39, 40 and 41.

Sub-assembly 310 consists of a metallic base 311 with a bent portion 312 (see Figures 39, 40 and 41) on which through appropriate openings are mounted the feed-through capacitors described previously in connection with Figure 26, namely, feed-through capacitors 112, 181, 187, 188, 130, 136 and 137. For example, in Figure 40 feed-through capacitor 188 can be seen, while in Figure 41 there is shown feed-through capacitor 137.

Mounted on the inclined portion 314 of the metallic base 311 (see Figures 39, 40 and 41) are the two stationary contact assemblies 61. Section **61*a* is mounted on the metallic sub-chassis 310 through a rivet 315 shown in Figure 39. Stationary contact assembly 61*a* is properly positioned through the engagement of the indexing extensions 316 of stationary contact assembly 61*a* with appropriate indexing openings such as 377 (see Figure 40) in metallic sub-chassis 310**.

In other words, stationary contact assembly **61*a* is provided with two indexing pins 316 and a rivet 315 so that through engagement of elements 315 and 316 with openings 317 in metallic sub-chassis 310, the stationary contact assembly 61*a* is not only positioned for engagement with the movable panels such as 224 but also secured to sub-chassis 310 stationary contact assembly 61*b* is provided also with similar indexing pins 316 and the rivet 315 and through these means it is mounted on the metallic sub-chassis 310**.

Because of the particular shape of the metallic sub-chassis 310 and of the stationary contacts such as 62 in Figure 38 and the appropriate mounting of the feed-through capacitors, it becomes simple to connect a stationary contact such as 62 in Figure 38 to its corresponding feed-through capacitor, in this particular example feed-through capacitor 136.

Not only is the operation easy since it involves merely the bending of the end portion of stationary contact 62, but this particular mounting method makes the current paths extremely short which is important for proper operation at ultra-high frequencies.

Also mounted on metallic sub-assembly 310 is a dielectric panel 320. Dielectric panel 320 is provided with appropriate terminals 321 to which, when the tuner of the present invention is mounted in a television receiver, are connected the different operating voltages. These four terminals 321 were referred to in Figures 26 and 27A by the numerals 122, 189, 132 and 190.

Also mounted on dielectric panel 320 are two terminals 322 to which can be connected the terminals of the transmission line 101 coming from the antenna 100. Mounted on panel 320 and in close proximity to the transmission line terminal 322 is one balanced transformer 103.

Dielectric panel 320 is seen more clearly in Figures 42, 43, 44 and the side view of Figure 45 and the cross-section of Figure 46. Figure 42 in particular shows one side of dielectric panel 320. Figure 44 shows the opposite side of dielectric panel 320, while Figures 43, 45 and 46 show the particular way in which terminals 321 are mounted on dielectric panel 320.

Terminal 321 consists of a conductive ribbon which is bent and inserted through two openings such as those shown at 325 in dielectric panel 320 and shaped at one end 326 so that an eyelet is produced. To this eyelet 326 may be connected the circuitry mounted on the metallic sub-chassis 310.

The opposite end of strip 321 is provided with openings 327 to which as previously mentioned are connected the different operating voltages.

I claim:

A frequency selector comprising a rotatable drum with two spaced supporting discs secured normal to a central shaft thereof, a plurality of tuning panels releasably secured solely by said two discs about their periphery and in alignment with said shaft, one of said discs having a plurality of circumferentially spaced indexing slots for engaging a corresponding end projection of individual tuning panels, the other disc having an individual radial extension opposite each of said indexing slots, the radial extensions being of spring material and extending above the secured panels for manual engagement, a latch projecting outwardly from each of said radial extensions and arranged to press upon an edge surface flat of its corresponding tuning panel when the panel is positioned between the discs and thereby firmly lock the panel in position therebetween, each radial extension being manually displaceable sufficiently to disengage its projecting latch from the associated panel edge surface flat and thereby unlatch the panel, each of said tuning panels having an active section extending beyond said other disc that is of firm construction and self-supporting in its circuit engagements in conjunction with its associated main panel section latched between the discs, the main and extendings panel sections of each tuning panel being joined by two edge ribs defining an opening for entry of the associated radial disc extension and latch and between which its edge surface flat is positioned for coacting with the latch.

References Cited in the file of this patent

UNITED STATES PATENTS

| | | |
|---|---|---|
| 2,078,909 | Gunther | Apr. 27, 1937 |
| 2,496,183 | Thias | Jan. 31, 1950 |
| 2,594,111 | Albrecht | Apr. 22, 1952 |
| 2,596,117 | Bell | May 13, 1952 |
| 2,611,807 | Lazzery | Sept. 23, 1952 |
| 2,646,513 | Marco | July 21, 1953 |
| 2,668,235 | Nordby | Feb. 2, 1954 |
| 2,700,729 | Chelgren et al. | Jan. 25, 1955 |
| 2,706,252 | Overman | Apr. 12, 1955 |

FOREIGN PATENTS

| | | |
|---|---|---|
| 541,150 | Germany | Jan. 9, 1932 |